(12) United States Patent
Righter

(10) Patent No.: US 6,650,103 B2
(45) Date of Patent: Nov. 18, 2003

(54) MAGNETIC SNAPBACK SENSOR CIRCUIT AND ELECTROSTATIC DISCHARGE CIRCUIT USING SAME

(75) Inventor: Alan W. Righter, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 249 days.

(21) Appl. No.: 09/871,551

(22) Filed: May 31, 2001

(65) Prior Publication Data

US 2002/0181176 A1 Dec. 5, 2002

(51) Int. Cl.[7] .......................... G01R 33/07; G01R 31/28
(52) U.S. Cl. ...................... 324/117 H; 324/763; 361/56
(58) Field of Search ...................... 361/56, 111, 124; 324/763, 117 H, 765, 769; 257/423, 427, 357, 356, 360

(56) References Cited

U.S. PATENT DOCUMENTS

| | | | | |
|---|---|---|---|---|
| 4,823,075 A | * | 4/1989 | Alley | 324/117 H |
| 5,570,034 A | * | 10/1996 | Needham et al. | 324/763 |
| 5,744,842 A | * | 4/1998 | Ker | 257/262 |
| 5,835,146 A | | 11/1998 | Stone | 348/416 |
| 5,940,258 A | | 8/1999 | Duvvury | 361/56 |
| 6,373,104 B1 | * | 4/2002 | Smith | 257/355 |

* cited by examiner

Primary Examiner—Rajnikant B. Patel
(74) Attorney, Agent, or Firm—Iandiorio & Teska

(57) ABSTRACT

A magnetic snapback sensor circuit for sensing current transients imposed on the snapback circuit including a current conductor loop; a conductor carrying current from a snapback circuit subject to current transients and intersecting with the conductor loop for magnetically generating a current in the loop; and a current detector circuit for generating an output responsive to the current flowing in the loop induced by a current transient.

15 Claims, 3 Drawing Sheets

MAGNETIC SNAPBACK SENSOR CIRCUIT AND ELECTROSTATIC DISCHARGE CIRCUIT USING SAME

FIELD OF INVENTION

This invention relates to a magnetic snapback sensor circuit, and to such a magnetic snapback sensor circuit useful in an electrostatic discharge (ESD) circuit.

BACKGROUND OF INVENTION

Snapback circuits employ the inherent parasitic bipolar transistor associated with each MOS transistor to accommodate increased current flow through such bipolar transistor to lower the maximum voltage at the MOS drain electrode in response to an electrostatic discharge. The original publication describing the snapback operation is "Snap-Back; A Stable Regenerative Breakdown Mode of MOS Devices," A. Ochoa, Jr., F. W. Sexton, T. F. Wrobel, G. L. Hash and R. J. Sokel, IEEE Transactions on Nuclear Science, Vol. NS-30, No. 6, pp. 4127–4130, December 1983. Electrostatic discharge generated by, for example, a person walking on a rug can introduce transient high voltage current flow of up to 2–3 amps for up to 150 nanoseconds, enough to damage or destroy integrated circuit components. One shortcoming to such snapback circuit solutions was that during the snapback mode the voltage applied to a circuit node by the ESD pulse could rise high enough to damage some on-circuit components (the snapback event was pronounced). To avoid this, techniques were employed to reduce the snapback effect such as bias the gate of the MOS transistor with respect to its drain to turn on the MOS transistor; this reduced the snapback effect and the associated voltage. One example of this is described in U.S. Pat. No. 5,940,258.

One problem with this approach is that during the high current exposure of the MOS transistor during the ESD event, the transistor gate oxide and oxide-silicon interface can be damaged by hot electrons emanated from the adjacent avalanching drain to backgate junction diode. To solve this problem, a timer circuit was employed to allow the MOS transistor to be biased on only for a limited amount of time. See U.S. Pat. No. 5,835,146.

A problem with the timer circuit approach above is that for low voltage ESD events, the time between timer activation and the ESD-induced activation voltage reaching a high enough threshold causes the timer to shut off (lower the voltage) on the MOS gate, which reintroduces the snapback high voltage the transistor is meant to shut off. In addition the timer would only attempt to shutoff the MOS gate once. Thus if the voltage took too long to reach a predetermined trigger level the timer would not operate as intended.

SUMMARY OF THE INVENTION

It is therefore an object of this invention to provide an improved magnetic snapback sensor circuit and method and to an improved electrostatic discharge circuit employing such a magnetic snapback sensor circuit and method.

It is a further object of this invention to provide such an improved magnetic snapback sensor circuit and method and electrostatic discharge circuit which responds even to low voltage, low rise transients.

It is a further object of this invention to provide magnetic snapback sensor circuit and method and electrostatic discharge circuit which introduces no additional resistive load.

It is a further object of this invention to provide magnetic snapback sensor circuit and method and electrostatic discharge circuit which is achievable with existing MOS components without re-engineering of the snapback MOS transistor.

It is a further object of this invention to provide magnetic snapback sensor circuit and electrostatic discharge circuit which does not operate under normally functional IC operating conditions.

It is a further object of this invention to provide magnetic snapback sensor circuit and method and electrostatic discharge circuit which is implementable with PMOS as well as NMOS transistors, and can be disposed between the power supply and I/O as well as between power supply terminals.

The invention results from the realization that a truly improved, simpler snapback sensor circuit can be achieved by using a conductor carrying current from a snapback circuit to magnetically induce a current in a conductor loop and detecting the induced current to operate the gate of the MOS transistor in the snapback circuit and more specifically to operate such an MOS transistor in an electrostatic discharge circuit either directly or through a timer or other control circuit.

This invention features a magnetic snapback sensor circuit for sensing current transients imposed on a snapback circuit. There is a current conductor loop and a conductor carrying current from the snapback circuit subject to current transients and intersecting with the conductor loop for magnetically generating a current in the loop. A current detector circuit generates an output responsive to the current flowing in the loop induced by a current transient.

In the preferred embodiment the loop may include a single turn, the current detector may include a Hall effect circuit, the Hall effect circuit may include a magnetotransistor circuit.

This invention also features an electrostatic discharge circuit including a snapback circuit including an MOS transistor with an inherent parasitic bipolar transistor and a magnetic snapback sensor circuit in series with the snapback circuit. The magnetic snapback sensor circuit includes a conductor loop, a conductor carrying current from a snapback circuit subject to electrostatic discharge and intersecting with the conductor loop for magnetically generating a current in the loop. There is a current detector circuit for generating an output responsive to the current flowing in the loop induced by an electrostatic discharge for controlling the operating bias on the gate of the MOS transistor.

In a preferred embodiment the MOS transistor may be an NMOS type. The magnetic snapback sensor circuit may include a timer circuit responsive to the output for timing the application of a bias to the gate. There may be a comparator circuit responsive to the output. The snapback circuit and a magnetic snapback sensor circuit may be disposed on an integrated circuit chip. The integrated circuit chip may include additional integrated circuitry powered by the same power supply. The loop may include a single turn. The current detector may include a Hall effect circuit and the Hall effect circuit may be implemented with a magnetotransistor transistor circuit. The snapback circuit and the magnetic snapback sensor circuit may be in series between power supply terminals or between a power supply terminal and an I/O terminal.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
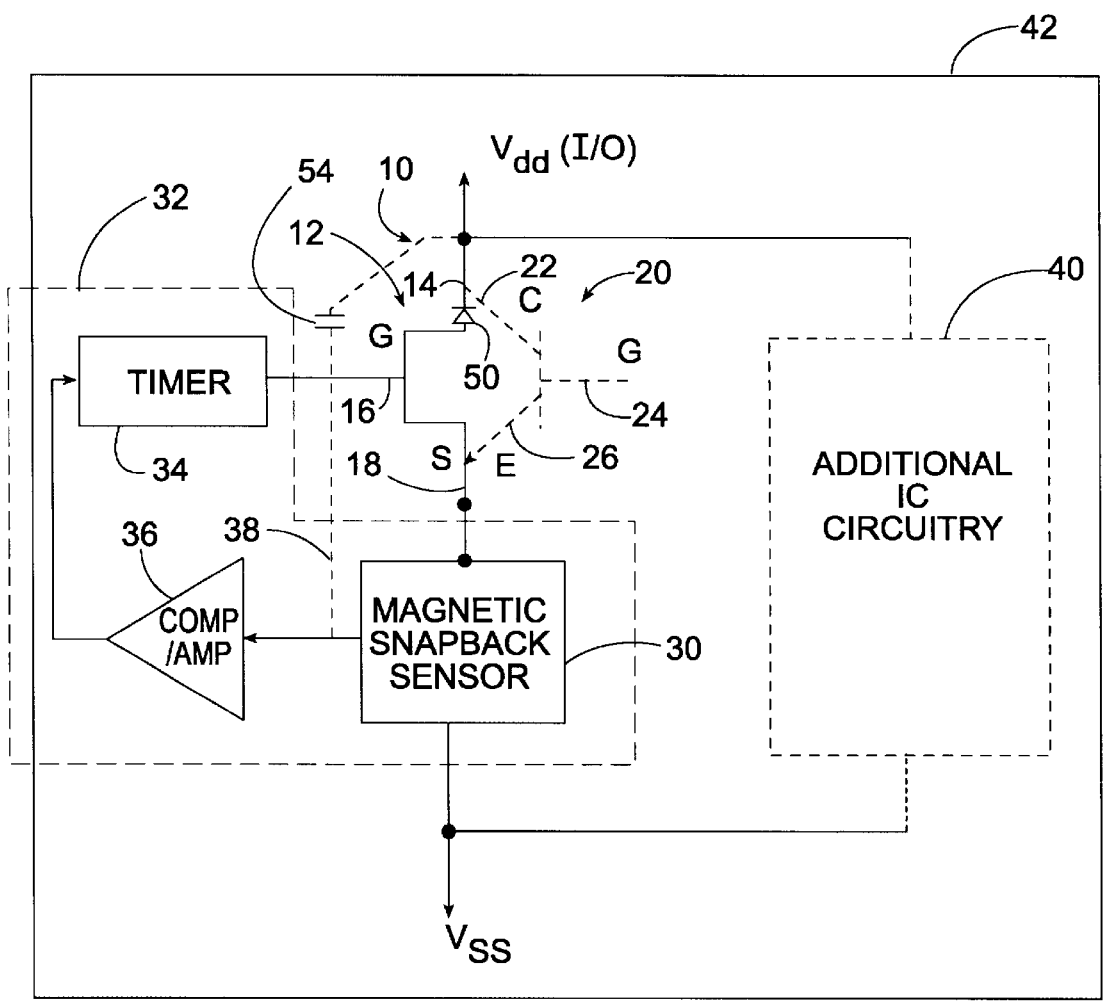
FIG. 1 is a schematic block diagram of an electrostatic discharge circuit employing a snapback magnetic sensor circuit according to this invention.

There is shown in FIG. 1 a snapback circuit 10 including an MOS transistor 12 having a drain 14, gate 16, and source 18. Associated with it is the inherent parasitic npn-type bipolar transistor 20 including collector 22, backgate base 24, and emitter 26. Snapback circuit 10 is connected in series with magnetic snapback sensor 30 between the power supply terminals Vdd and Vss, or alternatively between the I/O terminal in place of Vdd and terminal Vss. Magnetic snapback sensor 30 forms a part of a magnetic snapback sensor circuit 32 which may also include a timer 34 and a comparator or amplifier 36. The output for the magnetic snapback sensor 30 may be used in an adaptation of timer circuit 34 such as taught by U.S. Pat. No. 5,940,258. If the output signal voltage from magnetic snapback sensor 30 is not of a sufficient level to bias a MOS transistor gate 12 above threshold comparator or amplifier 36 may be used to boost the signal either to timer 34 or directly to gate 16. Snapback circuit 10 operates to discharge the current transients such as occur from electrostatic discharges that would adversely effect the additional IC circuitry 40 which is interconnected with the same I/O or power supply terminals and is disposed on the same IC chip 42. The power to operate this circuit comes from the electrostatic discharge for connections made either between the power supply terminals $V_{dd}$ and $V_{SS}$ or between I/O and $V_{SS}$.

Snapback circuit 10 operates in a conventional fashion. Upon the presence or the occurrence at drain 14 of a high transient voltage, the voltage across the drain to back gate diode 50 increases until the avalanche point is reached. At this point, current is injected into the backgate base 24 of bipolar transistor 20 raising its voltage level with respect to the emitter. When the backgate base 24 reaches a point approximately 0.7 volts in excess of the emitter 26 voltage current will be injected by the forward biased emitter to backgate base junction to flow through the base region to the collector/backgate diode 50. At this point, the voltage of diode 50 reduces to a sustaining avalanche voltage level. This decrease in voltage is referred to as the snap back mode. To reduce the higher pre-avalanche/snapback voltage, a parasitic capacitor 54 or in some cases a discrete capacitor connected between drain 14 and gate 16 is used to apply a portion of that voltage to gate 16 to bias the gate above its threshold voltage and reduce the snapback effect by bringing the voltage from the higher avalanche value to the lower sustaining voltage. This conventional arrangement works well except when the transient current or electrostatic discharge occurs at low levels or gradually over a long period of time. If gate 16 remains on too long the electrons from the avalanching diode can penetrate the oxide and cause hot carriers which impact reliability by degrading the transistor. To prevent this, it has been suggested to add a timer 34, U.S. Pat. No. 5,940,258 which will turn off the gate 16 after a certain period of time. However, timer 34 does not perform its function completely if the electrostatic discharge has a low ramp or is only gradual. The magnetic snapback sensor 30 and circuit 32 of this invention address that problem.

In prior art operation the voltage at drain D is used directly to operate a timer such as timer 34 to turn off gate 16. This is what results in the failure of timer 34 in the prior art to turn off the gate when the voltage change at drain 14 is at a low level or only very gradual.

In keeping with this invention, the current through transistor 12 is actually directly sensed by the series connected magnetic snapback sensor 30 whose output can be used to turn on a threshold voltage adjusted NMOS to control the gate 16 or it can be coursed through timer 34 or comparator or amplifier 36.

Figure 2:
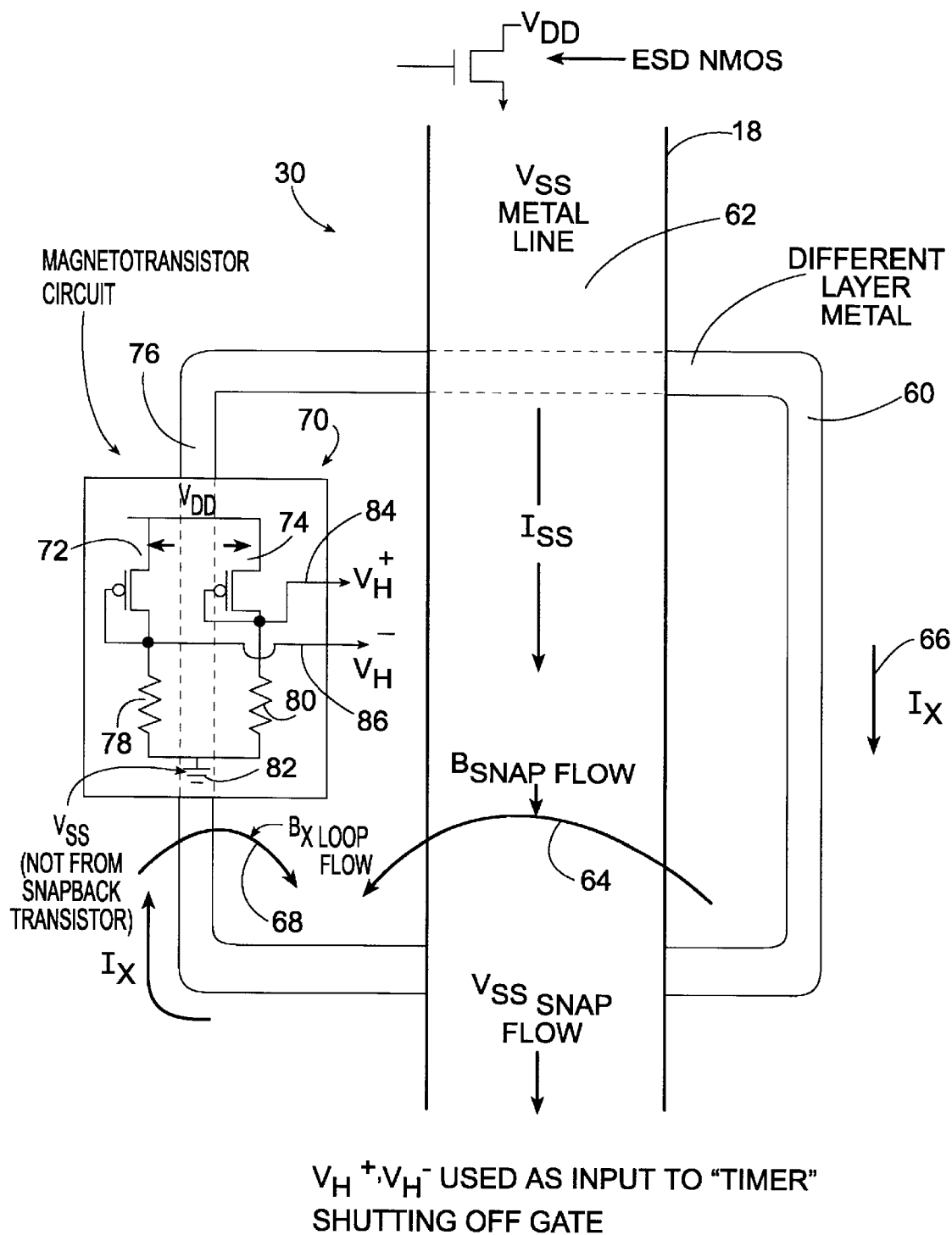
FIG. 2 is more detailed schematic diagram of the magnetic snapback sensor of FIG. 1.

The magnetic snapback sensor 30 is shown in greater detail in FIG. 2 as including a current conductor loop 60 which is intersected by the conductor 62 connected to the source 18 of MOS transistor 12. The flow of current $I_{SS}$ through it creates a magnetic field $B_{snap}$ in accordance with the right hand rule as indicated by arrow 64. This induces a current flow $I_X$ in loop 60 as indicated by arrow 66. This current flow $I_X$ induces a magnetic field $B_X$ as indicated at arrow 68. This magnetic field is detected by a Hall effect device such as magnetotransistor circuit 70. Magnetotransistor circuit 70 includes a pair of magnetotransistors 72 and 74 placed on either side of leg 76 of loop 60. Transistors 72 and 74 have their drains connected through resistors 78 and 80 to ground 82. Ground 82 is not the same as $V_{SS}$ as it is necessary for the electrostatic discharge circuit and the magnetic snapback sensor circuit contained within it to be independently connected between the terminals at which the electrostatic discharge is expected or other current transients are expected. Transistors 72 and 74 respond to the magnetic field to distribute the charge in opposite directions creating a differential voltage at the outputs taken at the drains 84 and 86 represented by the voltages $V_{h+}$ and $V_{h-}$. It is this voltage output that may be applied directly to gate 16 or applied to gate 16 through timer 34 or through timer 34 and an amplifier or comparator 36 or to some other control device to gate 16. Although the detector circuit 70 is shown as a Hall effect detector implemented by a magnetotransistor circuit, this is not a necessary limitation of the invention as any other kind of detector may be used. For example, a resistance may be placed in parallel with one leg of loop 60 and a high impedance amplifier used to read off that voltage which can then be applied to operate gate 16 either directly or through some control device such as timer 34 with or without amplifier or comparator 36.

Figure 3:
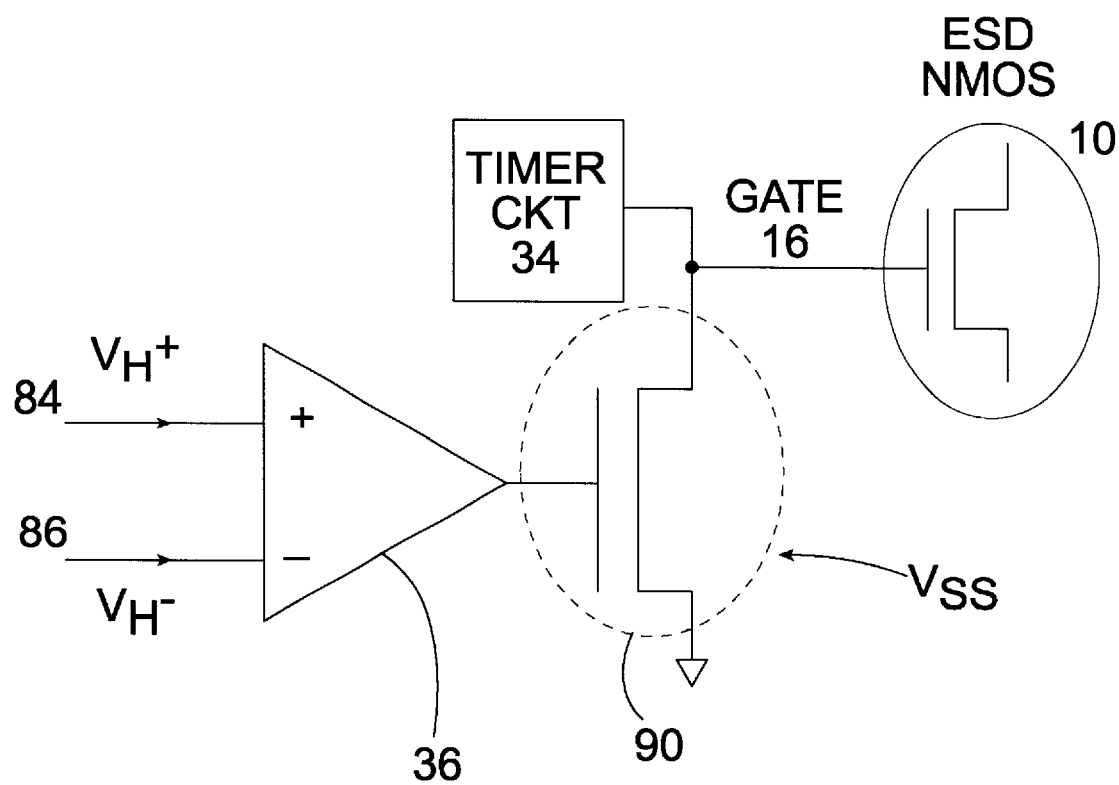
FIG. 3 is another implementation of the magnetic snapback sensor of FIG. 1.

In another implementation, the output terminals of the snapback sensor are compared using a simple MOS comparator circuit, with the output driving a threshold voltage-reduced NMOS transistor 90, FIG. 3, between ESD NMOS gate 16 and another VSS line. In this implementation, the gate would be driven directly to ground. NMOS 90 will act to turn off, or reduce, voltage on gate 16, superceding the activity of timer 34 for low voltage and slow $V_{DD}$ transient ESD events.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A magnetic snapback sensor circuit for sensing current transients imposed on a snapback circuit comprising:

a current conductor loop;

a conductor carrying current from a snapback circuit subject to current transients and intersecting with said conductor loop for magnetically generating a current in said loop; and a current detector circuit for generating an output responsive to the current flowing in said loop induced by a current transient.

2. The magnetic snapback sensor circuit of claim 1 in which said loop includes a single turn.

3. The magnetic snapback sensor circuit of claim 1 in which said current detector circuit includes a Hall effect circuit.

4. The magnetic snapback sensor circuit of claim 3 in which said Hall effect circuit includes a magnetotransistor circuit.

5. An electrostatic discharge circuit comprising:

a snapback circuit including an MOS transistor with an inherent parasitic bipolar transistor;

a magnetic snapback sensor circuit in series with said snapback circuit and including a conductor loop; a conductor carrying current from a snapback circuit subject to electrostatic discharge and intersecting with said conductor loop for magnetically generating a current in said loop; and a current detector circuit for generating an output responsive to the current flowing in said loop induced by an electrostatic discharge for controlling the operating bias on the gate of said MOS transistor.

6. The electrostatic discharge circuit of claim 5 in which said MOS transistor is an NMOS type.

7. The electrostatic discharge circuit of claim 5 in which said magnetic snapback sensor circuit includes a timer circuit responsive to said output for timing the application of a bias to said gate.

8. The electrostatic discharge circuit of claim 5 in which said magnetic snapback sensor circuit includes a comparator circuit responsive to said output.

9. The electrostatic discharge circuit of claim 5 in which said snapback circuit and said magnetic snapback sensor circuit are disposed on an integrated circuit chip.

10. The electrostatic discharge circuit of claim 5 in which said integrated circuit chip includes additional integrated circuitry powered by the same power supply.

11. The electrostatic discharge circuit of claim 5 in which said loop includes a single turn.

12. The electrostatic discharge circuit of claim 5 in which said current detector circuit includes a Hall effect circuit.

13. The electrostatic discharge circuit of claim 12 in which said Hall effect circuit includes a magnetotransistor circuit.

14. The electrostatic discharge circuit of claim 5 in which said snapback circuit and said magnetic snapback sensor circuit are in series between power supply terminals.

15. The electrostatic discharge circuit of claim 5 in which said snapback circuit and said magnetic snapback sensor circuit are in series between a power supply terminal and an I/O terminal.

* * * * *